United States Patent [19]
Alonso

[11] Patent Number: 4,680,479
[45] Date of Patent: Jul. 14, 1987

[54] METHOD OF AND APPARATUS FOR PROVIDING PULSE TRAINS WHOSE FREQUENCY IS VARIABLE IN SMALL INCREMENTS AND WHOSE PERIOD, AT EACH FREQUENCY, IS SUBSTANTIALLY CONSTANT FROM PULSE TO PULSE

[75] Inventor: Sydney A. Alonso, Norwich, Vt.

[73] Assignee: New England Digital Corporation, White River Junction, Vt.

[21] Appl. No.: 759,861

[22] Filed: Jul. 29, 1985

[51] Int. Cl.$^4$ .................. H03K 5/135; H03K 3/64
[52] U.S. Cl. ............................... 307/265; 307/271; 307/234; 84/1.04
[58] Field of Search .............. 307/265, 269, 271, 517, 307/518, 522, 523, 234; 84/1.04

[56] References Cited

U.S. PATENT DOCUMENTS

| | | | |
|---|---|---|---|
| 3,612,907 | 10/1971 | Braunholtz | 307/517 |
| 4,068,180 | 1/1978 | Nelligan | 307/518 |
| 4,163,946 | 8/1979 | Alberts | 307/269 |
| 4,349,754 | 9/1982 | Bull | 307/517 |
| 4,475,086 | 10/1984 | Allen | 307/265 |
| 4,562,549 | 12/1985 | Tanaka et al. | 307/265 |

Primary Examiner—John S. Heyman
Attorney, Agent, or Firm—Robert Shaw

[57] ABSTRACT

A pulse generator for outputting a train of electric pulses with a controllably constant period (i.e., the reciprocal of pulse rate) between pulses of the pulse train. The generator includes electrical circuitry which produces an internal train of pulses some of whose periods vary an unacceptable amount from one another. Further, modifying circuitry is connected to receive each pulse of the internal train of pulses, the further circuitry being operable to modify the period of each pulse, when necessary, to an acceptable period with respect to the immediately preceding pulse. The modifying circuitry includes delay circuitry which in controlled, in part, by an input pulse to be processed and which is adapted to delay the input pulse by a delay time determined by lateness of the input pulse and to provide an output pulse (which is the output of the generator and which in combination with other pulses forms the output pulse train of the pulse generator) whose period is substantially equal to (or within acceptable variation from) other pulses of the train of electrical pulses.

25 Claims, 5 Drawing Figures

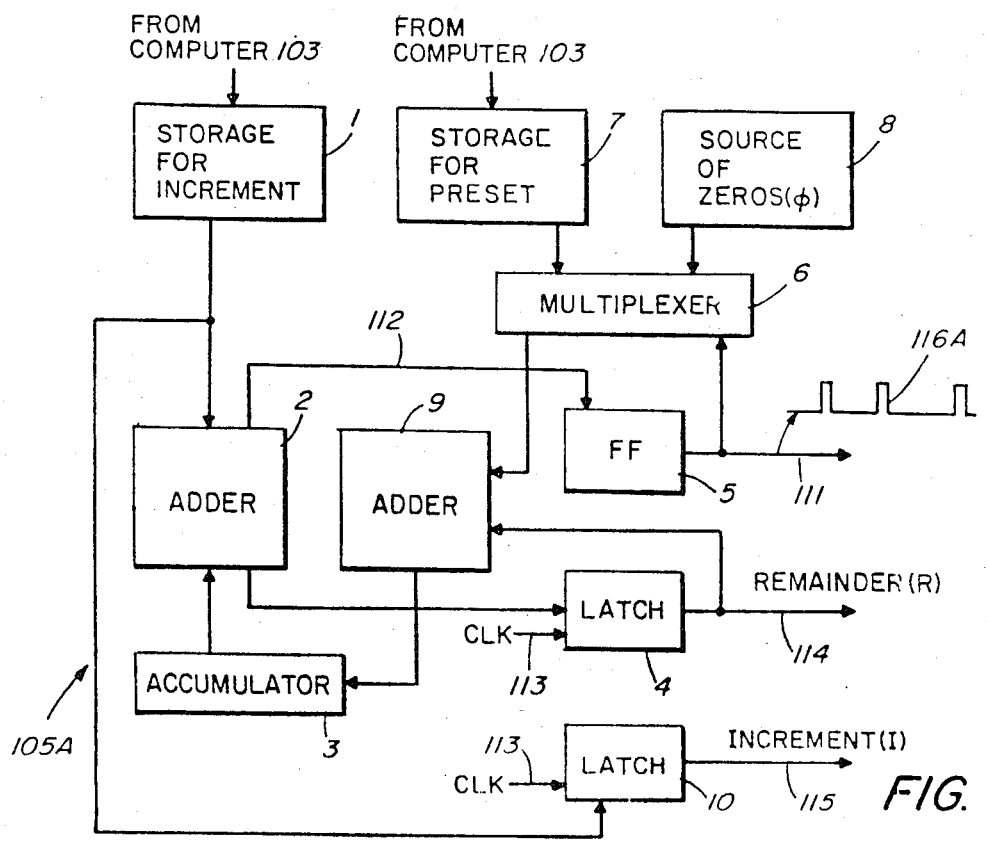

METHOD OF AND APPARATUS FOR PROVIDING PULSE TRAINS WHOSE FREQUENCY IS VARIABLE IN SMALL INCREMENTS AND WHOSE PERIOD, AT EACH FREQUENCY, IS SUBSTANTIALLY CONSTANT FROM PULSE TO PULSE

The present invention relates to pulse generators whose pulses may be used, for example, as sampling pulses in music synthesizers and the like.

Attention is called to U.S. Pat. Nos. 4,108,035 (Alonso); 4,178,882 (Alonso); 4,279,185 (Alonso); and 4,345,500 (Alonso et al.) and 4,554,855 (Alonso et al.); and to an application for Letters Patent Ser. No. 639,737 filed Aug. 13, 1984 (Gold).

While sounds other than musical sounds can be generated by synthesizers of the type herein described, this specification emphasizes systems which generate musical notes. It is taught in the Alonso ('185) patent that musical notes can be generated using a stored waveshape in the form of binary numbers stored in memory at various phase angles. It is taught in that patent that effects of aliasing distortion can be reduced in such a synthesizer by sampling the stored waveshape only at a frequency that is $2^N$ times the fundamental frequency of the musical note to be generated, where N is an integer. To provide a sampling frequency that meets the $2^N$ limitation and satisfies the Nyquist sampling theorem requires musical note oscillators that can vary in frequency in small increments typically, for example, a few Hz between 50 kHz and 100 kHz. An important use for the present pulse generator (the earlier patents termed similar apparatus a binary digital oscillator) is to provide pulse trains wherein the individual pulses serve as sampling pulses with the before-mentioned characteristics. (The term "pulse train" is used herein in its usual context to denote a number of serial pulses; a pulse train at one repetition rate furnishes sampling pulses for one note, while another pulse train at another repetition rate furnishes sampling pulses for another note, and so forth.)

Two aspects of those pulse trains are very important: the frequency of the pulses must be controllable over at least an octave at a high frequency (e.g., 50 to 100 kHz) and in very small increments (i.e., a few Hz); and the time between pulses of a particular pulse train (i.e., period) must be uniform, that is, be free of detectable jitter. To place this explanation in context, typical synthesizer instruments produce fundamental tones ranging from C1 having a frequency of about 32 Hz to C8 having a frequency of about 4,096 Hz. The human ear is capable of distinguishing thousands of frequencies within the range from C1 to C8. In certain ranges (i.e., 500 Hz to 1 kHz) some person can distinguish 0.25 Hz. Digital electronic instruments, then, are called upon to produce tones of varying complexity with fundamental frequencies of 32 Hz or less to greater than 5 kHz. (The complex tones have related frequencies, or harmonics, extending into the upper limit of audible sound, about 20 kHz.)

Synthesis of tones in keyboard instruments requires only a few frequencies, but synthesis of music of other instruments requires a large number of frequencies from C1 to C8 where the increment between the frequencies is small (e.g., 0.25 Hz or smaller). To produce frequencies over a wide range in small increments requires either extremely large registers and counters or unrealistically high clock rates. For example, in order to achieve results similar to those obtained from the oscillator described in the Alonso ('035) patent, earlier conventional techniques would require approximately 10-bit counters and a thirty-two megahertz clock rate.

Although keyboard instruments are not called upon to produce a large number of frequencies over their range, other instruments, such as violins, are capable of producing an immense number of discrete frequencies within their range. In order to produce the variable frequency characteristics of these instruments, it is important to have a pulse generator capable of generating frequencies over a wide range in narrow, controllable intervals. In addition, such a capability is important in electronic musical systhesizers in order to provide added interest to the sound being produced.

Accordingly, it is a principal object of the present invention to provide pulse generator whose output frequency can be varied to provide pulse trains whose frequencies vary in small increments (e.g., less than one Hz) from one another and yet to provide pulse trains in the form of pulses whose period varies less than a value perceptible to a human listener of music output from a synthesizer using the pulse generator.

Another object is to provide a pulse generator in which the periods between the successive pulse outputs of each pulse train varies less than about six hundred nanoseconds.

Still another object is to provide a pulse generator of more general application.

These and still further objects are addressed hereinafter.

The foregoing objects are achieved, generally, in a method of (and apparatus for) generating successive electrical pulses in the form of a pulse train in which the period between successive pulses (i.e., the reciprocal of the repetition rate) is substantially constant, that comprises: generating a first train of electrical pulses, some of whose periods vary from the substantially constant period by an unacceptable amount; noting the period between successive pulses of the first pulse train to determine when a next successive pulse exceeds the substantially constant period by an unacceptable amount; storing each pulse of the first pulse train to permit time delay of the pulse; and adjusting, when necessary, the output time of a pulse to correct for inexactness of the period thereof to provide an output pulse, in a second or output pulse train derived from the first pulse train, whose period is at an acceptably constant period with respect to the next previous pulse in the second output pulse train and, hence, to provide an output pulse train in the form of pulses in which the period between pulses is substantially constant or acceptably constant.

The invention is hereinafter described with reference to the accompanying drawing in which:

FIG. 3 shows in detail one form the pulse train source can take; and

FIGS. 4A and 4B show two variations of the pulse period adjuster.

Figure 1:
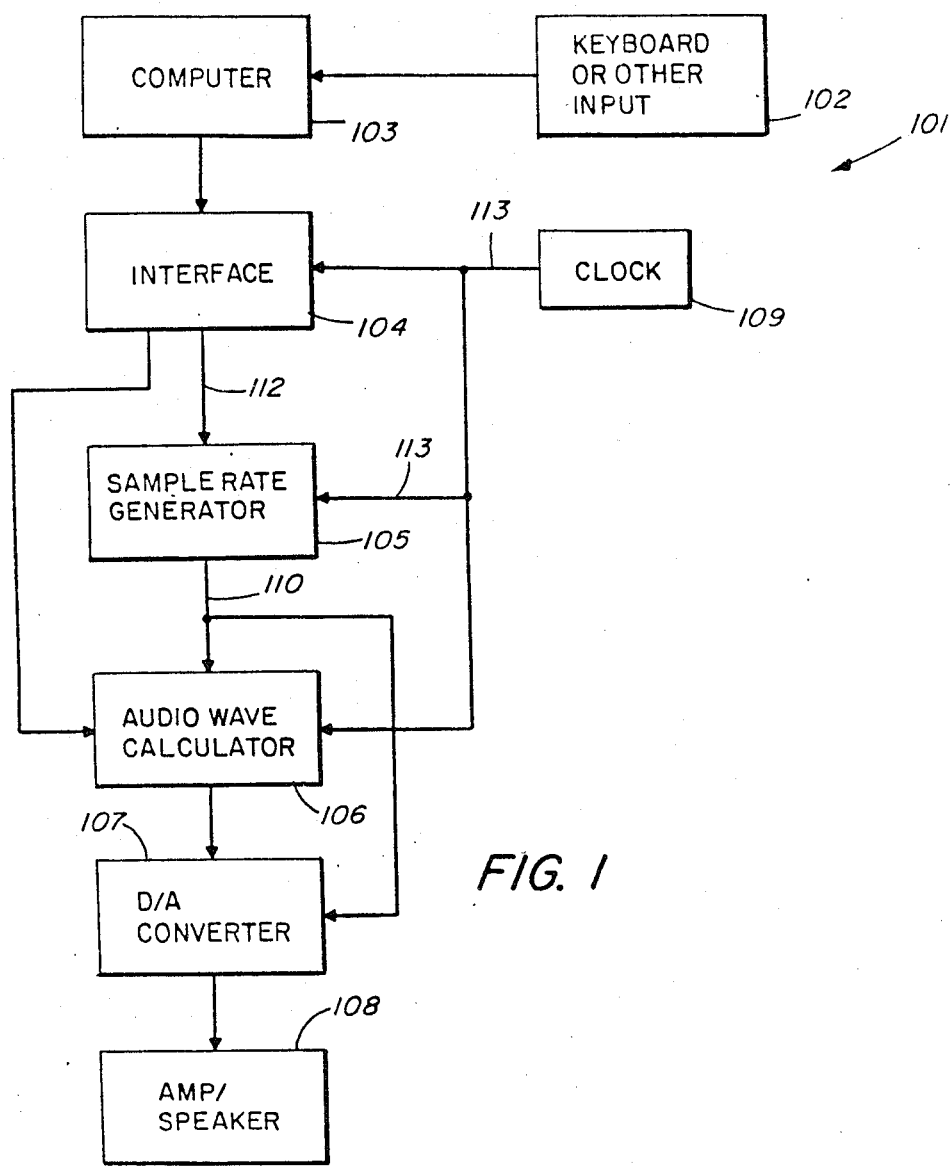
FIG. 1 is a diagrammatical representation of a music synthesizer embodying a pulse generator (or sample-rate generator) of the present invention.

Turning first to FIG. 1, there is shown at 101 an electronic instrument for synthesizing acoustical notes.

The instrument 101 may take a form similar to what is shown in the above-noted patents and patent application. Briefly, a keyboard (or other input) 102 provides signals to a computer 103. Typically, the signals designate notes called for when a player depresses one or more keys. The signals from the keyboard are connected as input to the computer 103. The synthesizer 101 operates on the basis of instructions from the computer which, among other things, provides instructions to effect readout of binary digital signals from an audio wave calculator 106 in the form of complex waveforms that contain fundamentals, harmonics, non-harmonics (i.e., higher order components) and, often, harmonics of the higher order components or non-harmonics. A useful embodiment of an audio wave calculator is discussed in U.S. Pat. No. 4,554,855 (Alonso et al.), where musical notes are generated using a plurality of partial-timbre channels. Each channel, of the plurality of partial-timbre channels, includes a memory which stores a complex waveform (see the Alonso '185 patent) and each waveform is sampled at a particular sampling rate. It is taught in the Alonso ('185) patent that the sampling rate should be $2^N$ times the fundamental frequency of the note being synthesized; that rate should also be high enough to satisfy the requirements of the Nyquist sampling theorem. In the instruments of greatest interest here, the sampling rate is between 50,000 and 100,000 Hz and the difference between available sampling rates may be as small as the order of one cycle per second. It will be appreciated, then, that generating the required sampling signals is no easy task. The task is made even more difficult by the strictures against jitter. The term "jitter" refers to differences in the period between successive pulses in a pulse train (see the Alonso et al. '500 patent); it has been determined for present purposes, that jitter in sampling period less than about 600 nanoseconds is not perceptible to a human listener of music. It is toward providing a sample rate generator (or other pulse rate generator) 105 in FIG. 1 that meets the foregoing requirements (i.e., that provides required uniformity of period in its output pulse trains 116B, FIG. 2, at its output 110) that the present invention is directed.

The sampling rate, of course, establishes only the frequency or frequencies of the output of the audio wave calculator 106. The timbre of that output, as above indicated, is determined by the constituents from the various stored waveforms and those constituents are determined by the instruments being synthesized. Clearly, a violin sound will require different stored waveforms than an organ sound. The binary numbers stored to form a stored waveform in the audio wave calculator 106 are generated by the computer 103 and stored in wave memory (see the Alonso '185 patent for the form of digitally stored waveforms) whence they are read out, converted to analog form by a digital-to-analog (D/A) converter 107 in FIG. 1, and amplified and transduced at 108. The signals that pass from the audio wave calculator 106 to the D/A converter 107 can be a summation of digital signals from a plurality of partial-timbre channel within the calculator 106 which typically also includes a summer to combine those signals (see the Alonso et al. U.S. Pat. No. 4,554,855). On the other hand, the present invention can function in the context of the Alonso '035 patent.

To complete the overall explanation of the synthesizer depicted diagrammatically in FIG. 1, it includes an interface 104 whose function is to pass control parameters from the computer 103 to the various modules of the synthesizer 101 for a plurality of channels and to allow the computer to interrogate the current status of the various modules and channels (in apparatus now being built there are thirty-two channels operated in time-division multiplex). The foregoing functions are timed by signals from a system clock 109. Most of the rest of this specification is directed to the sample rate generator 105.

Two methods that can be employed to generate the train of pulses that are used to achieve sampling in a musical synthesizer are (1) use of dividers to divide a clock frequency to useful sub-multiples and (2) use of adders and accumulators as is done in the Alonso '035 patent and the Alonso et al. '500 patent. The present invention recognizes that in the method (2), the period between successive pulses in a train of output pulses will differ, causing jitter.

According to the present teaching, the jitter caused by the method "(b 2)" may be effectively removed by noting that those pulses in the pulse train 116A that occur at incorrect times are late. Furthermore, as is later explained, they are late by less than one calculation period $T_g$ for the particular channel. Also, as later explained, the amount of lateness is equal to remainder R divided by increment I multiplied by the calculation period $T_g$. The effect of this lateness (i.e., jitter) may be reduced arbitrarily by subjecting each output pulse to a delay equal to the calculation period $T_g$ minus the amount of lateness as defined above.

Pulses in the pulse train 116A occurring at the correct time, i.e., zero lateness, are given a full calculation period delay $T_g$. Late pulses are given less delay and, therefore, the jitter of the final output pulse train labeled 116B in FIG. 2 may be arbitrarily reduced, the limit of this reduction being the degree to which it is convenient to subdivide the calculation (or gross) period $T_g$. For example, a calculation period of ten microseconds might be subdivided into one hundred parts $T_f$—also called fine periods herein. If the jitter is reduced to less than one hundred nanoseconds, the human ear will not perceive its effect, as noted above. The foregoing is summarized in the following expression, $$T_d = T_g \left(1 - \frac{R}{I}\right), \tag{1}$$

where $T_d$ is the delay time in seconds, $T_g$ is the calculation period in seconds, R is the remainder in an adder 2 in FIG. 3 in the explanation below (after a carry pulse is outputted on a conducter 114) and I is the increment which is added to the accumulator 3 in FIG. 3.

The foregoing equation can be expressed in terms of the number of fine clock pulses of period $T_f$ as follows, $$N_{df} = \frac{T_g}{T_f} \left(1 - \frac{R}{I}\right), \tag{2}$$

where $N_{df}$ is the desired delay expressed in the number of pulses in the fine clock.

As an example, the gross calculation period $T_g$ may be ten microseconds, this period being divided into one hundred equal periods of the first fine period $T_f$ to give a value to $T_f$ of one hundred nanoseconds. The ten microsecond delay is effected by a down counter 16 in FIGS. 4A and 4B which counts down in one hundred steps for a full count. The output at 110 of the down counter 16 is the output of the sample rate generator 105 in FIGS. 1 and 2. A more detailed explanation now follows.

Figure 2:
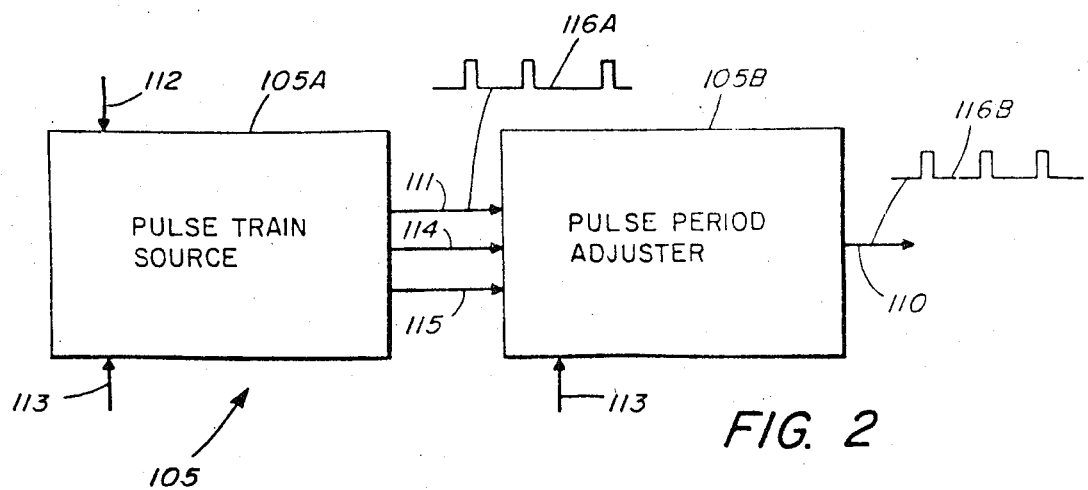
FIG. 2 shows diagramatically the pulse generator (or sample-rate generator) of FIG. 1 but divided into a pulse train source and a pulse period adjuster.

The sample rate generator (or pulse generator) shown as a single block 105 in FIG. 1 is shown as two blocks 105A and 105B in FIG. 2 and the latter is shown in greater detail in two embodiments in FIGS. 4A and 4B. The generator 105 in FIG. 2 consists of the pulse train source 105A that outputs the train of pulses 116A on the conductor 111 to a pulse period adjuster 105B; the train of pulse 116A can be that outputted by the note oscillator in the Alonso '035 patent or the note oscillator in the Alonso et al. '500, for example. The pulse period adjuster 105B functions to modify the period between successive pulses at 111, if modification is needed, to provide successive pulses at the output 110 that are within acceptable tolerances in terms of period. Outputs 114 and 115 from the pulse train source 105A contain respectively the remainder R and the increment I. The pulse train 116A at 111 is a series of single pulses, whereas the outputs R and I at 114 and 115, respectively, are multi-digit, binary numbers. The clock inputs at 113 in FIG. 1 are shown in FIG. 2 as two separate inputs, but the clock pulses are identical to each input. It is shown below that the pulse period adjuster 105B serves to adjust the periods of the pulses at 111 to acceptable tolerances in the period between pulses in the pulse train 116B that is emitted at 110. In the adjuster 105B, as above indicated, pulses in the input 111 are delayed (up to ten microseconds) depending on the amount of jitter in each pulse relative to the immediatedly previous pulse in the pulse train. The mechanism by which jitter is effectively removed from the pulses in the pulse train 116B is explained below with reference to FIGS. 4A and 4B, but first the pulse train source 105A is explained more fully with reference to FIG. 3.

Inputs to the pulse train source 105A come from the computer 103 to the storage for increment numbers labeled 1 and the storage for preset numbers labeled 7. At each calculation, an output from the accumulator 3 and an increment number from the storage 1 are inputted to an adder 2 and summed. If the adder 2 modulus is not exceeded (i.e., no carry), the sum is stored in a latch 4 and a multiplexer 6 is set to select the number 0 from a source of zero 8. The sum from latch 4 and zero from the multiplexer 6 are added to the adder 9 and written back into the accumulator 3 and, on the next cycle, to the adder 2. The cycling of the adder 2 is continued until the modulus of the adder 2 is exceeded, at which time a carry pulse at 112 is fed to a flip-flop 5 (this becomes the pulse train 116A at the output 111) and the remainder, if any, R, from the adder 2, is written to the latch 4. Any remainder in the latch 4 is added in this case in the adder 9 to a preset number from the storage 7 through the multiplexer 6 and the sum from the adder 9 is written to the accumulator 3. The initial inputs to the adder 2 during the next cycle will be, then, an increment number I from the storage 1 plus the sum of the preset number and any remainder, which sum is received from the accumulator 3. The multiplexer 6 is enabled by pulses from the FF 5, which pulses are the stored value of the previous carry pulse from the adder 2. The increment numbers I are connected through a latch 10 to the output 115. An example follows.

This example illustrates the steady state operation, i.e., after at least one carry from any previous accumulator 3 contents.

In a 100,000 Hz system with 8-bit devices for a 100,000 Hz sample rate, the preset would be 255 and the increment would be 1 and, hence, there can be no remainder. (If the adder 2 modulus—in the more general case—is not exceeded, no carry, the sum is stored in the latch 4 and the multiplexer 6 is set to select the number 0 from the source of zeros 8.) The sum from latch 4 and zero from the multiplexer 6 are added in the adder 9 and written back into the accumulator 3 and thence to the adder 2 whose modulus is exceeded to produce a carry. After the carry, the accumulator 3 will contain the preset number 255. Then during every subsequent cycle the increment of 1 will be added by the adder 2 to the accumulator content 255 producing a carry. This causes an output pulse at 112 and the preset number 255 to be added to the remainder 0 and written back to the accumulator 3.

As another example, for a 66,000 Hz output, after some carry the accumulator 3 will contain the preset number 253. Then on the next cycle the increment number 2 will be added by the adder 2 to the accumulator number 3 to produce a sum of 255 and non carry. The sum 255 is written back to the accumulator 3. The increment number 2 is added by the adder 2 to the number 255 in the accumulator 3 to produce a carry output and a remainder of 1. The preset number 253 is added to the remainder 1 and written to the accumulator 3. The next cycle the number 254 in the accumulator 3 is added to the increment number 2 to produce a carry and no remainder. The preset number 253 is written back to the accumulator 3; this is the same condition as the first cycle of this example. It will be noted that the two carry pulses were produced in three cycles with a pattern of 2,1,2, 1, etc. The average time between carries is 1½ cycles corresponding to 66,000 Hz. The present invention aims to correct the 2,1,2, 1 jitter to as near to 1½,1½,1½, 1½ as possible.

Other frequencies give more complex results but the logic is the same. It suffices for present purposes to note that there are periodic pulses at 111 that constitute a pulse train output at 111 whose average period is the correct period from the pulse train source 105A and there are remainder numbers R at 114 and increment numbers I at 115.

The pulse period adjuster abstractly takes the form of $105B_1$ in FIG. 4A to implement equation (2) above. Alternatively, for reasons of circuit economy, the adjuster $105B_2$ in FIG. 4B is used in actual apparatus. Other circuit configurations are possible. The adjuster $105B_1$ includes a divider 11 to receive as input remainder numbers R at 114 and increment numbers I at 115. It serves to provide the quotient R/I (where R/I<1) at its output (the quotient R/I is a measure of lateness of the particular pulse being processed). The quotient is subtracted from 1 by a subtracter 13 to give at its output a value $1-R/I$. The value $1-R/I$ is multiplied by an integer number $T_g/T_f$ by a multiplier 14. The output of the multiplier 14 is $T_g/T_f(1-R/I)$ and is input at 50 to the down counter 16. The down counter 16 is clocked at a period $T_f$ until it reaches zero to provide the requisite delay such that, when the down counter 16 reaches zero, the correct sampling time is indicated by the condition of zero and a pulse outputs at 110.

The down counter 16 receives as a load pulse the output at 111 from the FF 5 in FIG. 3. To place the foregoing in context, reference may be had to Table I below.

TABLE I

| $\frac{R}{I}$ | Delay Out (Full delay 10 microseconds) | Delay for 10 microsecond delay system $\left(1 - \frac{R}{I}\right)$ | | For $T_g = 100$ (number of counts to load into down counter 16) |
|---|---|---|---|---|
| 0 | 1 cycle | 10 | microseconds | 100 |
| ½ | ½ cycle | 5 | microseconds | 50 |
| ⅔ | ⅓ cycle | 3.333 | microseconds | 33 |
| ⅓ | ⅔ cycle | 6.666 | microseconds | 66 |
| 9/10 | 1/10 cycle | 1 | microseconds | 10 |
| 99/100 | 1/100 cycle | 0.1 | microseconds | 1 |

The foregoing rises from the expression (1), $T_d=T_g(1-R/I)$, previously discussed. In the first listing in Table I, $T_d=T_g$ which, in the context of the application, means a count 100 count delay which equals 10 microseconds in the present system. In the third listing, $T_d=100(1-\frac{2}{3})=\frac{1}{3}$ or 3.333 microseconds which is represented by 33 down counts, the multi-digit number 33 being that number which is stored in the down counter 16 at the beginning of the count. The input at 50 to the counter 16 is a measure, then, of $T_d$.

The adjuster 105B$_2$ in FIG. 4B includes a minus log ROM 17 to receive the increment I as input and a log ROM 114 to receive the remainder R as input, the outputs of the ROMs 17 and 18 being summed by an adder 19 to provide the value log R−log I which is inputted to an antilog ROM 20 whose output 50A is the value $N_{df}$ in expression (2). The value $N_{df}$ is, as before, an N-bit number representing $T_d$ (which is in seconds) in terms of the number of fine clock pulses of period $T_f$. In practice, the delay is accomplished by the expedient of clocking the down counter 16 at ten megahertz or 100 times the clock rate of the rest of the system.

Earlier mention is made to time-division multiplexing. For that purpose the elements 1, 7, and 3 in FIG. 2 are plural storage elements.

Further modifications of the invention herein disclosed will occur to persons skilled in the art and all modifications are deemed to be within the scope of the invention as defined by the appended claims.

What is claimed is:

1. Apparatus for generating successive electrical pulses whose period is predetermined to be substantially constant, that comprises:
    means for generating a first train of electrical pulses, some of whose periods vary from the predetermined substantially constant period by an unacceptable amount;
    means for noting the period between successive pulses of the first pulse train to determine when a next successive pulse in the first pulse train exceeds the predetermined substantially constant period by an unacceptable amount;
    means for storing each pulse of the first pulse train to a permit time delay of the pulse; and
    means for adjusting, when necessary, the output time of a pulse, in an output pulse train derived from the first pulse train, to correct for inexactness of the period thereof to provide an output pulse whose period is at an acceptably constant period with respect to the next previous pulse in the output pulse train, and hence, to provide an output pulse train in the form of successive pulses wherein the period between pulses is substantially constant.

2. Apparatus according to claim 1 in which the period between pulses of the output pulse train varies less than about 600 nanoseconds.

3. Apparatus according to claim 1 in which the period between pulses of the output pulse train varies less than about 100 nanoseconds from pulse-to-pulse.

4. A pulse generator according to claim 1 in which said means for generating a first train of electric pulses is operable to generate a plurality of variable frequency pulse trains whose frequencies are controllably variable over a range of frequencies.

5. A pulse generator according to claim 4 in which said range of frequencies at least an octave at a frequency of at least about 50 kHz.

6. A pulse generator according to claim 4 in which said means of adjusting is operable to provide said variable frequency pulse trains at frequencies that vary a few Hz from pulse train to pulse train.

7. A pulse generator according to claim 6 in which the means for adjusting is adapted to maintain variations of period between pulses of each output pulse train of the plurality of variable frequency pulse trains to a variation less than about 600 nanoseconds.

8. Apparatus for generating successive electrical pulses whose period is substantially constant, that comprises:
    means for generating a first train of electrical pulses, some of whose periods vary from the substantially constant period by an unacceptable amount;
    means for noting the period between successive pulses of the first pulse train to detemine when a next successive pulse in the first pulse train exceeds the substantially constant period by an unacceptable amount;
    means for storing each pulse of the first pulse train to permit time delay of the pulse; and
    means for adjusting, when necessary, the output time of a pulse, in an output pulse train derived from the first pulse train, to correct for inexactness of the period thereof to provide an output pulse whose period is at an acceptably constant period with respect to the next previous pulse in the output pulse train, and hence, to provide an output pulse train in the form of successive pulses wherein the period between pulses is substantially constant;
    in which the means for generating comprises the combination of an adder and accumulator, carry pulses from the adder being said train of pulses, inputs to the adder including an increment number, outputs from the adder including a carry pulse and, often, a remainder, in which the means for adjusting is adapted to apply a delay to all pulses of the pulse train, the maximum delay being designated $T_g$, and in which the means to adjusting sovles the expression $$T_d = T_g \left(1 - \frac{R}{I}\right),$$

wherein $T_d$ is the actual delay applied to a pulse being processed, R is said remainder and I is the increment number.

9. Apparatus according to claim 8 which includes a system clock, in which the adder is clocked at the frequency of the system clock and in which the combination of the adder and accumulator interact with other operating elements in the apparatus to provide said first train of pulses at frequency which is a fraction of the frequency of the system clock.

10. Apparatus according to claim 9 which includes a down counter which is connected to recieve as one input the value $T_d$ and which is operable to down count from that value to zero, at which time the down counter provides an output pulse, successive pulses, thus generated, constituting said successive electrical pulses whose period is substantially constant.

11. Apparatus according to claim 10 in which the down counter is loaded by said pulse being processed, down counter has a maximum count of $T_g$, in which the down counter is clocked by fine clock pulses of period $T_f$.

12. Apparatus according to claim 11 wherein $T_g$ equals one hundred and wherein there are one hundred fine clock pulses of period $T_f$.

13. A method of generating successive electrical pulses in the form of a pulse train in which the period between successive pulses is substantially constant, that comprises the steps of:
generating a train of electrical pulses, some of whose periods vary from the substantially constant period by an unacceptable amount;
noting the period between successive pulses of the pulse train to determine when a next successive pulse in the pulsation exceeds the substantially constant period by an unacceptable amount;
storing each pulse of the pulse train to a permit time delay of the pulse; and
adjusting, when necessary, the output time of a pulse to correct for inexactness of the period thereof to provide an output pulse whose period is at an acceptably constant period with respect to the next previous pulse in the pulse train and hence, to provide an output pulse train in the form of pulses in which the period between pulses is substantially constant.

14. A method according to claim 13 in which the generating step includes varying the frequency of the pulse from over at least an octave at a high frequency of about 50 to 100 kHz and in increments of a few Hz and in which the period between successive pulses of the output pulse train at a particular frequency vary no more than about 1.25 Hz.

15. A method according to claim 13 in which the period between the pulses of the output pulse train vary less than about 600 nanoseconds from pulse-to-pulse.

16. A method according to claim 13 in which the period between pulses in the output pulse train varies less than 100 nanoseconds from pulse-to-pulse.

17. A method according to claim 13 which includes generating a plurality of output pulse trains whose frequencies vary from one another, and in which the period between pulses in each output pulse train of the plurality of output pulse trains varies less than about 600 nanoseconds from pulse-to-pulse.

18. A pulse generator that comprises:
means for generating a first train of pulses some of which have periods with respect to the immediately previous pulse which vary excessively from an acceptable variation; and
means for modifying the period of each pulse of the train of pulses to an acceptable period with respect to the immediately preceding pulse, said means for modifying being connected to receive said each pulse, said
means for modifying comprises delay means connected to receive as input said each pulse of the train of pulses, which delay means is operable to provide an output pulse representative of said each pulse, and means to control the timing of said output pulse to a period with respect to the immediately preceding output pulse to an acceptable value to provide and output pulse train from the pulse generator in which the pulses forming the output pulse train vary in terms of period from one another in a controllably acceptable manner.

19. A pulse generator according to claim 18 in which said means for generating a first train of pulses is operable to generate a plurality of variable-frequency pulse trains whose frequencies are variable over a wide range of frequencies and in very small increments.

20. A pulse generator according to claim 19 in which frequency of the plurality of pulse trains is variable over at least an octave and in which said small increments are a few Hz.

21. A pulse generator according to claim 18 in which the pulses forming the output pulse train vary in terms of period from one another less than about 0.25 Hz.

22. In a musical synthesizer, a method of generating a smapling pulse train whose pulses have periods that are substantially constant with respect to one another, that comprises:
generating a first train of electrical pulses, some of whose periods vary from one another in that they have periods that are longer than the acceptably constant period and hence, are late;
noting the period between successive pulses of the first train of electrical pulses to determine the amount lateness, if any, of the next successive pulse with respect to the immediately preceding pulse;
storing said next successive pulse to permit a time delay thereof; and
adjusting, when necessary, the output time of the said next successive pulse, in an output pulse train derived from the first pulse train and consisting of the delayed pulses, to correct for any lateness of the said next successive pulse to provide a pulse output whose period is acceptably constant with respect to the next previous pulse in the output pulse train.

23. In a musical synthesizer, a method of generating a plurality of sampling pulse trains, each pulse train of the plurality of pulse trains consisting of successive electrical pulses having periods that are substantially constant with respect to one another, that comprises:
generating a plurality of pulse trains of electrical pulses, some of the periods between pulses of each of the plurality of pulse trains varying from one another in that successive pulses have periods that are longer than the acceptably constant period and hence are late, the frequencies of the pulse trains being variable with respect to one another,
noting the period between successive electrical pulses of said each pulse train of successive electrical pulses to determine the amount of lateness, if any, of the next successive pulse with respect to the immediately preceding pulse;
storing said next successive pulse to permit a time delay thereof; and
adjusting, when necessary, the output time of the said next successive pulse, in an output pulse train derived from the first pulse train and consisting of the delayed pulses, to correct for any lateness of the said next successive pulse to provide a pulse output whose period is acceptably constant with respect to the next previous pulse in the output pulse train.

24. A method according to claim 23 in which said frequencies of the plurality of sampling pulse trains thus generated vary from one another by a few Hz.

25. A method according to claim 24 in which said frequencies are variable over at least an octave at a frequency of at least 50 kHz.

* * * * *